United States Patent
Graves

(10) Patent No.: US 7,030,659 B2
(45) Date of Patent: Apr. 18, 2006

(54) SIGNAL SWITCH WITH REDUCED ON RESISTANCE AND UNDERSHOOT PROTECTION

(75) Inventor: Christopher M. Graves, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 95 days.

(21) Appl. No.: 10/926,171

(22) Filed: Aug. 24, 2004

(65) Prior Publication Data

US 2006/0044019 A1    Mar. 2, 2006

(51) Int. Cl.
*H03K 19/20* (2006.01)
*H03K 19/173* (2006.01)
*H03K 17/04* (2006.01)
*H03K 17/16* (2006.01)
*G06F 7/38* (2006.01)

(52) U.S. Cl. .................. 326/113; 326/26; 326/27; 326/37; 326/38; 327/374

(58) Field of Classification Search ............. 326/113, 326/26, 27, 37, 38; 327/374
See application file for complete search history.

(56) References Cited

U.S. PATENT DOCUMENTS

| | | | | |
|---|---|---|---|---|
| 5,963,080 A | * | 10/1999 | Miske et al. | 327/534 |
| 6,100,719 A | * | 8/2000 | Graves et al. | 326/86 |
| 6,236,259 B1 | * | 5/2001 | Goodell et al. | 327/534 |
| 6,320,408 B1 | * | 11/2001 | Kwong | 326/31 |

OTHER PUBLICATIONS

U.S. Appl. No. 10/453,249 filed Jun. 2, 2003 (TI-34946).

* cited by examiner

*Primary Examiner*—Rexford Barnie
*Assistant Examiner*—Jason Crawford
(74) *Attorney, Agent, or Firm*—William B. Kempler; W. James Brady, III; Frederick J. Telecky, Jr.

(57) ABSTRACT

An electronic switch applies ground potential to the backgate of a MOS pass transistor when the transistor is in the off state and the switch is open, during normal conditions. When the transistor is switched to the on state and the switch is closed, the gate voltage is applied to the backgate of the pass transistor in order to reduce the threshold voltage and the on resistance. During an undershoot condition, the gate of the pass transistor is connected to the negative voltage applied to an input port and this voltage is also connected to the backgate of the pass transistor to prevent the pass transistor from being biased on or the parasitic NPN transistor from being biased on and transmitting the input glitch to the output.

20 Claims, 2 Drawing Sheets

SIGNAL SWITCH WITH REDUCED ON RESISTANCE AND UNDERSHOOT PROTECTION

TECHNICAL FIELD OF THE INVENTION

This invention relates to an electronic switch and in particular a NMOS switch.

BACKGROUND OF THE INVENTION

Electronic switches, such as cross bar switches, often consist of a single NMOS transistor connected between an input port and an output port. When the switch is open, there is a high impedance path between the input and the output to provide circuit isolation. When the switch is closed, it provides a low resistance path from the input to the output. These switches allow for signal propagation in either direction. Therefore, either port could be an input or an output port.

As these switches are utilized to propagate signals at higher and higher frequencies, the switches must have a lower RC network value to pass the higher frequency signals and a small resistance delta across the input voltage in order to minimize signal distortion.

One known solution to the high frequency data switching problem is to use a charge pump to increase the voltage on the gate of the pass transistor. This requires an on-chip oscillator and produces a higher current drain than is desired. Another known solution to this problem is to bias the back gate of the pass transistor to either the source or the drain input voltage in order to make $V_{BS}$ equal to zero volts. This biasing technique causes the NMOS threshold voltage to lower and the drive strength to increase, which reduces the on resistance. However, this circuit arrangement can compromise the isolation of the output from the input if the voltage applied to the input terminal goes far enough below ground to turn on the parasitic NPN transistor or cause the pass transistor to conduct because the $V_{GS}$ voltage increases. If the output is high, this can cause the output to be pulled down which can cause a glitch in the output. If the glitch is of sufficient magnitude, it can cause the output to change state.

Accordingly, there is a need for a switch circuit which has a reduced on resistance and provides undershoot protection.

SUMMARY OF THE INVENTION

It is a general object of the present invention to provide a switch circuit which has a reduced ON resistance and provides undershoot protection.

This and other objects and features are provided in accordance with one aspect of the invention by a signal switch comprising a MOS pass transistor coupled between a first port and a second port. A drive circuit coupled to a gate and a back gate of the MOS pass transistor. An undershoot detection circuit coupled to the path between ports for detecting an undershoot condition. An undershoot protection circuit is coupled to an output of the undershoot detection circuit and to the gate and back gate of the MOS pass transistor for preventing the MOS pass transistor from being turned on by the undershoot and creating a bus disturbance.

Another aspect of the invention includes a signal switch having a MOS pass transistor coupled between a signal input and a signal output. A driver circuit comprises a first biasing circuit coupled to a back gate of the MOS pass transistor for reducing the $V_T$ of the MOS pass transistor when the MOS pass transistor is turned ON to allow a signal at the signal input to propagate to the signal output. A second biasing circuit is coupled to a gate and the back gate of the MOS pass transistor to prevent an undershoot from propagating to the signal output.

DETAILED DESCRIPTION OF THE PRESENT INVENTION

Figure 1:
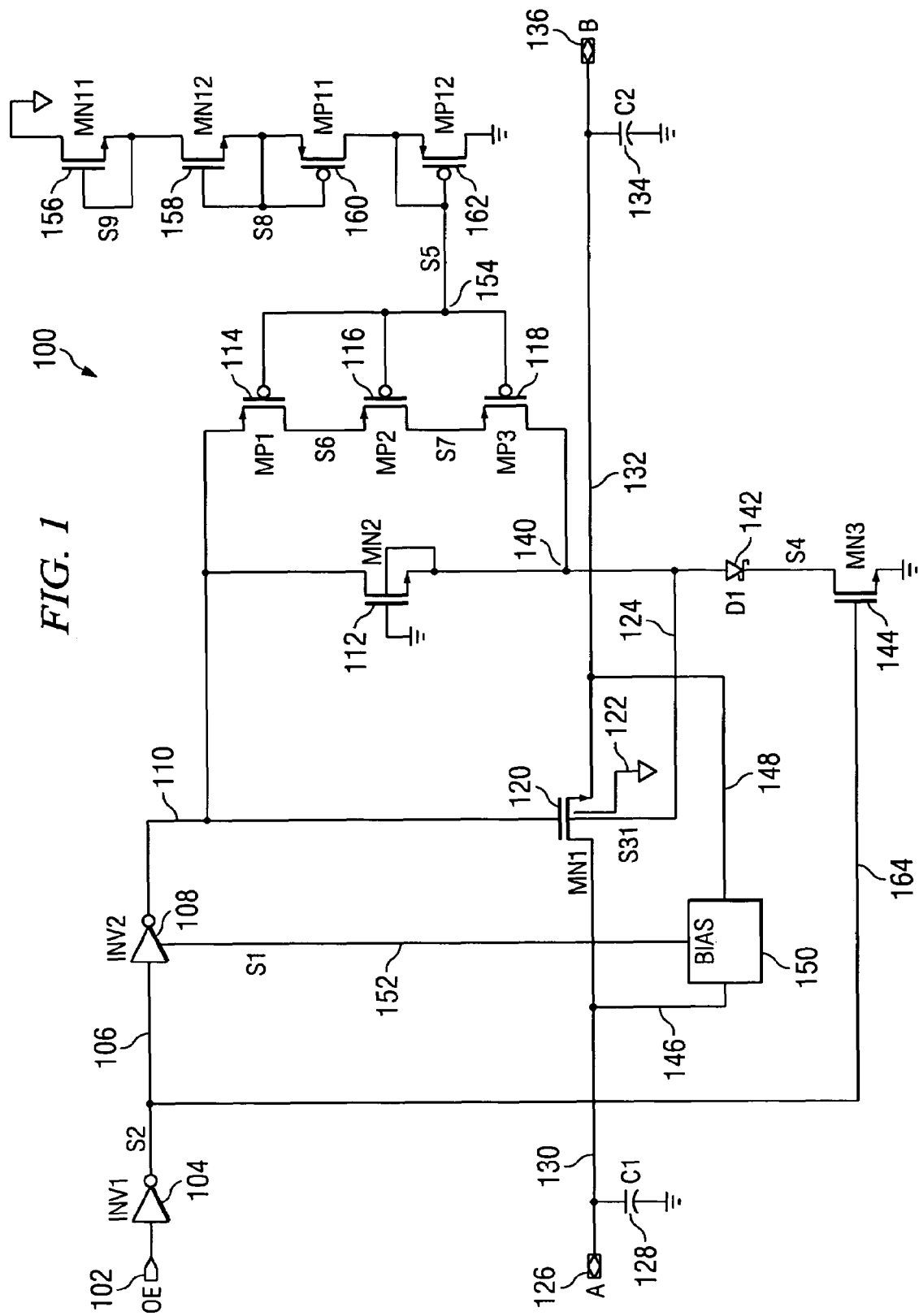
FIG. 1 is a schematic diagram, partially in block form, of a switch circuit according to the present invention.

FIG. 1 shows an electronic switch according to the present invention generally as 100. Terminals 126 and 136 function as input/output terminals for the switch. As is well known to those skilled in the art, either terminal 126, 136 can serve as an input terminal, and the other terminal serve as an output terminal. That is, the signal propagation can go from 126 to 136 or from 136 to 126. A capacitor 128 is connected between terminal 126 and ground and a capacitor 134 is connected between terminal 136 and ground. Terminal 102 receives this signal OE which is the output enable signal used to control the NMOS pass transistor switch into either the open or closed mode. An NMOS pass transistor switch 120 is coupled between the terminals 126 and 136 by lines 130 and 132, respectively. The gate of pass transistor 120 is coupled to the terminal 102 by inverter 104, output line 106, inverter 108 and output line 110. A circuit 150 is used to determine whether there is a negative glitch on either port 126 or port 136 and to apply an appropriate negative power supply voltage to inverter 108 via line 152. Circuits capable of performing the function of block 150 are known in the art and need not be described in detail here.

Line 110 is also coupled to the drain of NMOS transistor 112, the gate of which is connected to ground. The back gate of transistor 112 is connected to its source and the source is connected to line 140 which is connected via line 124 to the back gate of NMOS pass transistor 120. Line 140 is also coupled to the cathode of a Schottky diode 142 which has its anode connected to the drain of NMOS transistor 144. The source of NMOS transistor 144 is connected to ground and the gate thereof is connected to line 106 via line 164. Three PMOS transistors 114, 116, 118 have their source-drain paths connected in series between lines 110 and 140. Each of these transistors has long channel gate lengths in order to provide a high impedance path between lines 110 and 140. The gates of all three transistors are connected together and connected to node S5 at line 154.

The gates of transistors 114, 116, 118 are coupled to a bias circuit comprising NMOS transistors 156 and 158 and PMOS transistors 160 and 162 connected in series. Each of the transistors has its gate connected to its source, so that the $V_{GS}$ voltage is equal to zero volts and all the transistors are biased in their off state. However, there is enough sub-threshold leakage current through the transistor stack to be the equivalent of a resistor divider circuit. Since the NMOS and PMOS transistors have similar sub-threshold leakage values, the bias voltage on node S5 is approximately the input voltage $V_{CC}$ divided by four. Thus, the biasing circuit comprising transistors 156, 158, 160 and 162 acts like a high impedance resistor divider.

In the embodiment of the present invention illustrated in FIG. 1, the circuit is built using a P substrate process. In order to change the back gate on the NMOS pass transistor 120, it is necessary to provide for isolation of this transistor by the use of a guard ring. The guard ring is coupled via line 122 to $V_{CC}$. This enables the back gate voltage to be changed instead of having the back gate tied to ground. The use of an isolated pass transistor is not required for an N substrate process.

Under normal operating conditions, the back gate of pass transistor 120 is biased to ground with the switch in the OFF state. When the output enable control signal OE goes low, the N-channel transistor (not shown) of inverter 108 is on and pulls the gate voltage of the pass transistor 120 to ground. In addition, the gate of transistor 144 is tied to the output of inverter 104, and therefore to a voltage equal to $V_{CC}$, which pulls node S31 low via line 124 and through the series combination of Schottky diode 142 and NMOS transistor 144. This enables the switch to operate in a low leakage mode to avoid any bus disturbance.

When the output enable signal goes high, the output of inverter 104 will be low and the output of inverter 108 will be high. Thus, the gate of pass transistor 120 will be high and the transistor will be on. The gate of transistor 144 is connected to the output of inverter 104 and is therefore connected to ground which eliminates the pull down path from node S31. The P channel transistor (not shown) of inverter 108 is turned on and connected to the pass transistor 120 back gate through the series stack of transistors 114, 116 and 118 via line 124. The three transistors 114, 116 and 118 provide a high impedance path between the pass transistor 120 and its back gate. The high impedance is provided by the long channel gate lengths and by biasing the gates of the three transistors at a voltage of approximately one quarter $V_{cc}$ instead of ground. This gate reference voltage is provided by the sub-leakage currents of transistors 156, 158, 160 and 162 and requires only a few microamperes of current. Node S31 will be pulled to the power supply rail through the P channel transistor of inverter 108. This will cause the $V_{GS}$ of pass transistor 120 to be a positive voltage for any I/O port voltage, on terminals 126 or 136, that is below $V_{CC}$. The highest the voltage $V_{GS}$ can be is the $V_{forward}$ of the parasitic PN diode. It is formed between the backgate and the source of transistor 120. If the path through transistors 114, 116 and 118 was not a high impedance path, there would be a low impedance path from the power supply via the P channel transistor in inverter 108 and through the parasitic diode of pass transistor 120 to the I/O port 126 or 136. This would cause the circuit to consume considerably more current.

Figure 2:
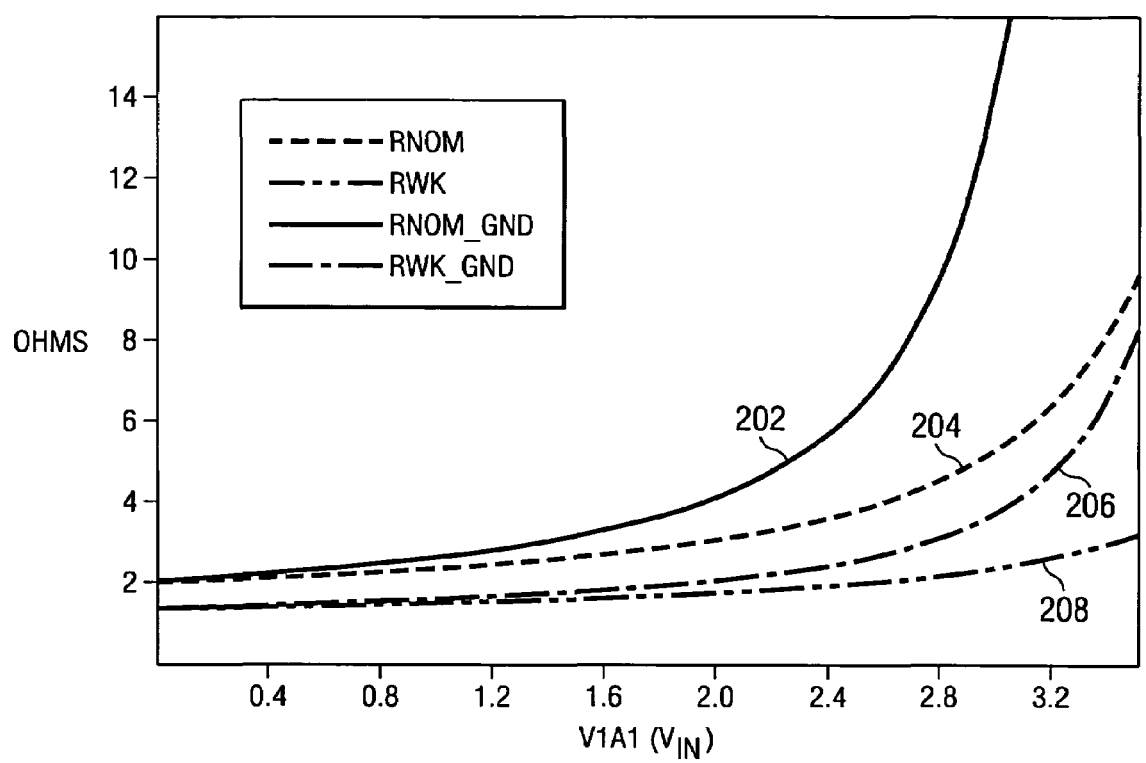
FIG. 2 is a plot showing the change in the $R_{ON}$ of the pass transistor switch of FIG. 1.

Referring now to FIG. 2, there are four graphed lines showing the effect of the present invention. Graphed lines 202 and 206 represent the prior art technique where the backgate is tied to ground for two different NMOS pass transistors 120. Graphed lines 204 and 208 represent the same two transistors in which the present invention is implemented so that the backgate of NMOS pass transistor 120 is tied to the bias voltage. As can be seen by comparing the two sets of graphed lines, the overall resistance of the switch $R_{ON}$ is less for graphed lines 204 and 208 and remains in the linear region for a greater range of input voltage. This reduces the attenuation of the signal through the switch and reduces distortion of the signal as the input voltage $V_{IN}$ increases.

Biasing the pass transistor 120 backgate to a positive voltage with respect to the source and drain, that is, $V_{GS}$ is greater than zero volts, causes the NMOS transistor threshold voltage to be lower which increases the drive strength when the transistor is on. This, in turn, results in a lower and flatter on resistance input voltage graphed line for the switch. The on resistance improvement becomes even more dramatic as the input voltage increases, as shown by the longer flat area in FIG. 2.

Returning now to FIG. 1, another aspect of the invention is to provide undershoot protection of the switch when it is open. Without the undershoot protection circuit of the present invention, when the gate of pass transistor 120 is tied to ground, and an undershoot event occurs in which the input signal goes below ground, the $V_{GS}$ of the pass transistor 120 would become positive. For a large negative glitch, the pass transistor 120 would turn on and attempt to pull down the bus connected to the output of the switch. If the output were high, a glitch would appear on the output bus and if the voltage of the glitch was high enough, it could cause the bus to change state.

In order to avoid such bus disruptions, both the gate and the backgate of pass transistor 120 are tied to the negative voltage so both the NMOS and parasitic NPN transistors are kept off and the switch remains open. The circuits 150 is used to detect a negative glitch applied to either port 126 or 136. The output of the circuit 150 to the lower supply voltage of inverter 108 and is at ground during normal operation. During an undershoot event, this voltage is tied to a negative voltage. This voltage then appears at the output of inverter 108 on line 110 which is tied to the gate of NMOS pass transistor 120 when the output signal OE is low. This allows the negative voltage applied to either port 126 or 136 to be translated to line 110 which will keep the $V_{GS}$ of the pass transistor 120 equal to zero volts. In addition, transistor 112 is utilized to connect the backgate of the pass transistor 120 to the negative voltage glitch. Transistor 112 is off during normal conditions because its gate is tied to ground. This isolates the gate and backgate of pass transistor 120. When an undershoot event occurs, the negative voltage on lines 152 and 110 causes the $V_{GS}$ of transistor 112 to be positive and allows node S31 to also be connected to a negative voltage level. The backgate of transistor 120 is also the base of the parasitic NPN transistor formed from the source to drain so that connecting node S31 to the negative voltage glitch keeps this NPN transistor off.

Schottky diode 142 is required to prevent, during an undershoot event, the backgate of pass transistor 120 remaining at ground potential, which could result in a bus disturbance. The Schottky diode 142, during an undershoot event, becomes reversed bias and blocks the current path from node S31 to ground.

Figure 3:
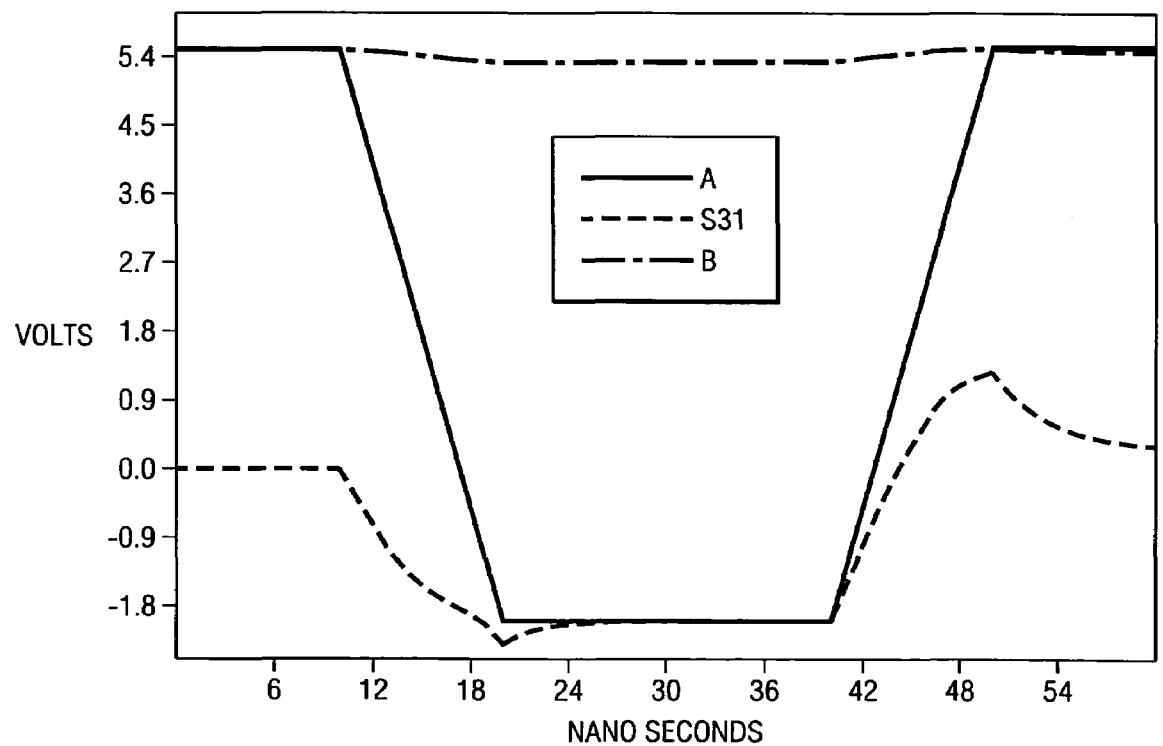
FIG. 3 is a simulation of the undershoot protection provided by the circuit of FIG. 1.

FIG. 3 shows the plot of a simulation of the undershoot protection provided by the circuit shown in FIG. 1. The Graphed line A is the input voltage to the switch. The plot of the input voltage shows an undershoot condition having an input voltage of –2 volts for about 20 nanoseconds. The Graphed line B is the output voltage of the switch. As can be seen from this Graphed line, there is only a very small change in the output voltage during the undershoot. This is because the node S31 voltage follows the undershoot voltage to keep the parasitic NPN transistor turned off during the glitch in the input voltage, so that the switch remains open.

While the invention has been shown and described with reference to preferred embodiments thereof, it is well understood by those skilled in the art that various changes and modifications can be made in the invention without departing from the spirit and scope of the invention as defined by the appended claims.

The invention claimed is:

1. A signal switch comprising:
    an MOS pass transistor coupled between a first port and a second port;
    a drive circuit coupled to a gate and a back gate of the MOS pass transistor
    an undershoot detection circuit coupled to the path between ports for detecting an undershoot condition; and
    an undershoot protection circuit coupled to an output of the undershoot detection circuit and to the gate and back gate of the MOS pass transistor for preventing the MOS pass transistor from being turned on by the undershoot and creating a bus disturbance.

2. The signal switch of claim 1 wherein the MOS pass transistor is a NMOS transistor.

3. The signal switch of claim 2 wherein the NMOS transistor is an isolated transistor.

4. The signal switch of claim 2 further comprising a Schottky diode coupled between the back gate and ground to isolate the back gate from ground during an undershoot.

5. The signal switch of claim 1 wherein the drive circuit further comprises a plurality of MOS transistors coupled in the path between the gate of the MOS pass transistor and the back gate thereof.

6. The signal switch of claim 5 wherein the plurality of MOS transistors provides a high impedance path between the gate of the MOS pass transistor and the back gate thereof.

7. The signal switch of claim 4 wherein the drive circuit further comprises a plurality of MOS transistors coupled in the path between the gate of the MOS pass transistor and the back gate thereof.

8. The signal switch of claim 4 wherein the plurality of MOS transistors provides a high impedance path between the gate of the MOS pass transistor and the back gate thereof.

9. The signal switch of claim 1 further comprising a MOS transistor coupled between the gate of the MOS pass transistor and the back gate thereof, the MOS transistor being biased normally off and conducting only during an undershoot.

10. The signal switch of claim 2 further comprising a NMOS transistor coupled between the gate of the MOS pass transistor and the back gate thereof and having a gate connected to ground.

11. In a signal switch having a MOS pass transistor coupled between a signal input and a signal output, a driver circuit comprising:
    a first biasing circuit coupled to a back gate of the MOS pass transistor for reducing the $V_T$ of the MOS pass transistor when the MOS pass transistor is turned ON to allow a signal at the signal input to propagate to the signal output; and
    a second biasing circuit coupled to a gate and the back gate of the MOS pass transistor to prevent an undershoot from propagating to the signal output.

12. The driver circuit of claim 11 wherein the MOS pass transistor being biased is a NMOS transistor.

13. The driver circuit of claim 12 wherein the NMOS transistor is an isolated transistor.

14. The driver circuit of claim 11 further comprising a Schottky diode coupled between the back gate and ground to isolate the back gate from ground during an undershoot.

15. The driver circuit of claim 11 further comprising a plurality of MOS transistors coupled in the path between the gate of the MOS pass transistor and the back gate thereof.

16. The driver circuit of claim 15 wherein the plurality of MOS transistors provides a high impedance path between the gate of the MOS pass transistor and the back gate thereof.

17. The driver circuit of claim 14 further comprising a plurality of MOS transistors coupled in the path between the gate of the MOS pass transistor and the back gate thereof.

18. The driver circuit of claim 14 wherein the plurality of MOS transistors provides a high impedance path between the gate of the MOS pass transistor and the back gate thereof.

19. The driver circuit of claim 11 further comprising a MOS transistor coupled between the gate of the MOS pass transistor and the back gate thereof, the MOS transistor being biased normally off and conducting only during an undershoot.

20. The driver circuit of claim 12 further comprising a NMOS transistor coupled between the gate of the MOS pass transistor and the back gate thereof and having a gate connected to ground.

* * * * *